United States Patent [19]

Kobayashi

[11] Patent Number: 4,766,572
[45] Date of Patent: Aug. 23, 1988

[54] SEMICONDUCTOR MEMORY HAVING A BYPASSABLE DATA OUTPUT LATCH

[75] Inventor: Yasuo Kobayashi, Tokyo, Japan
[73] Assignee: NEC Corporation, Japan
[21] Appl. No.: 813,604
[22] Filed: Dec. 26, 1985
[30] Foreign Application Priority Data Dec. 27, 1984 [JP] Japan .................... 59-277356

[51] Int. Cl.$^4$ .................. G11C 7/00; G11C 8/00
[52] U.S. Cl. .......................... 365/190; 365/233; 365/189
[58] Field of Search .............. 365/189, 205, 207, 208, 365/190, 233, 230; 307/530

[56] References Cited

U.S. PATENT DOCUMENTS

| | | | |
|---|---|---|---|
| 4,060,794 | 11/1977 | Feldman et al. | 365/189 X |
| 4,366,556 | 12/1982 | Kyomasu et al. | 365/189 |
| 4,415,994 | 11/1983 | Ive et al. | 365/189 |
| 4,573,147 | 2/1986 | Aoyama et al. | 365/190 |
| 4,603,403 | 7/1986 | Toda | 365/189 |
| 4,616,341 | 10/1986 | Andersen et al. | 365/189 |

FOREIGN PATENT DOCUMENTS 0104850 4/1984 European Pat. Off. ............ 365/233

Primary Examiner—Stuart N. Hecker
Assistant Examiner—Glenn A. Gossage
Attorney, Agent, or Firm—Laff, Whitesel, Conte & Saret

[57] ABSTRACT

A semiconductor memory is disclosed which attains a data read operation at a high speed with a low power dissipation. The memory includes a sense amplifier amplifying a data signal stored in the selected memory cell, a data latch circuit latching the output signal of the sense amplifier, a switching circuit outputting the output signal of the sense amplifier before the data latch circuit latches the output signal of the sense amplifier and outputting the output signal of the data latch circuit after the data latch circuit latches the output signal of the sense amplifier, and an output circuit producing an output data signal responsive to the output signal of the switching circuit.

8 Claims, 11 Drawing Sheets

SEMICONDUCTOR MEMORY HAVING A BYPASSABLE DATA OUTPUT LATCH

BACKGROUND OF THE INVENTION

The present invention relates to a semiconductor memory device, and more particularly to a data read-out circuit in a semiconductor memory device.

In a semiconductor memory device, a data signal which is read from a memory cell selected by address signals is amplified by a sense amplifier and then supplied to a data output control circuit. The data output control circuit generates at a data output terminal an output data corresponding to the read data signal.

In order to reduce power consumption, it has been carried out to shorten both a selection time of the memory cell and an enabled time of the sense amplifier. Even if the sense amplifier is changed to a disenabled state, the output data is required to continue to be generated at the data output terminal. For this purpose, a data latch circuit is provided between the sense amplifier and the data output control circuit. The data latch circuit latches the output signal of the sense amplifier and supplies this latched data to the data output control circuit. Accordingly, the data output control circuit continues to receive the read-out data even after the sense amplifier is disenabled. The output data thus continues to be obtained from the output terminal.

However, the data latch circuit requires an additional time interval during which it latches the output of the sense amplifier and drives the data output control circuit in accordance with the latched result. For this reason, a data read time (i.e., a period from a time point of the address input to that of the output data generation) is prolonged to deteriorate a high speed data read-out operation.

SUMMARY OF THE INVENTION

Therefore, an object of the present invention is to provide a semiconductor memory attaining a high speed data read-out operation.

Another object of the present invention is to provide a semiconductor memory having an improved data read-out circuit.

A semiconductor memory according to the present invention comprises a sense amplifier amplifying a data signal read from a selected memory cell, a data latch circuit latching an output signal of the sense amplifier, a switching circuit responding to a control signal and selecting either one of output signals of the sense amplifier and the data latch circuit, and an output control circuit generating at a data output terminal an output data responsive to an output signal of the switching circuit.

The switching circuit has a function of bypassing the output signal of the sense amplifier to transfer it to the output control circuit without passing through the latch circuit. Therefore, the output control circuit responds to the output signal of the sense amplifier without a substantial time delay. The output signal of the sense amplifier is also supplied to the data latch circuit and stored therein. The switching circuit thereafter selects in response to the control signal the output signal of the data latch circuit which is to be supplied to the output control circuit. The output data at the data output terminal is thereby held.

Accordingly, the present invention provides a semiconductor memory in which the data read-out operation is performed at a high speed and the output data is held even after the sense amplifier is changed to the disenable-state to reduce power consumption.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF PRIOR ART

In order to facilitate the understanding of the present invention, a semiconductor memory device according to prior art will be described below with reference to FIGS. 1 and 2.

Figure 1:
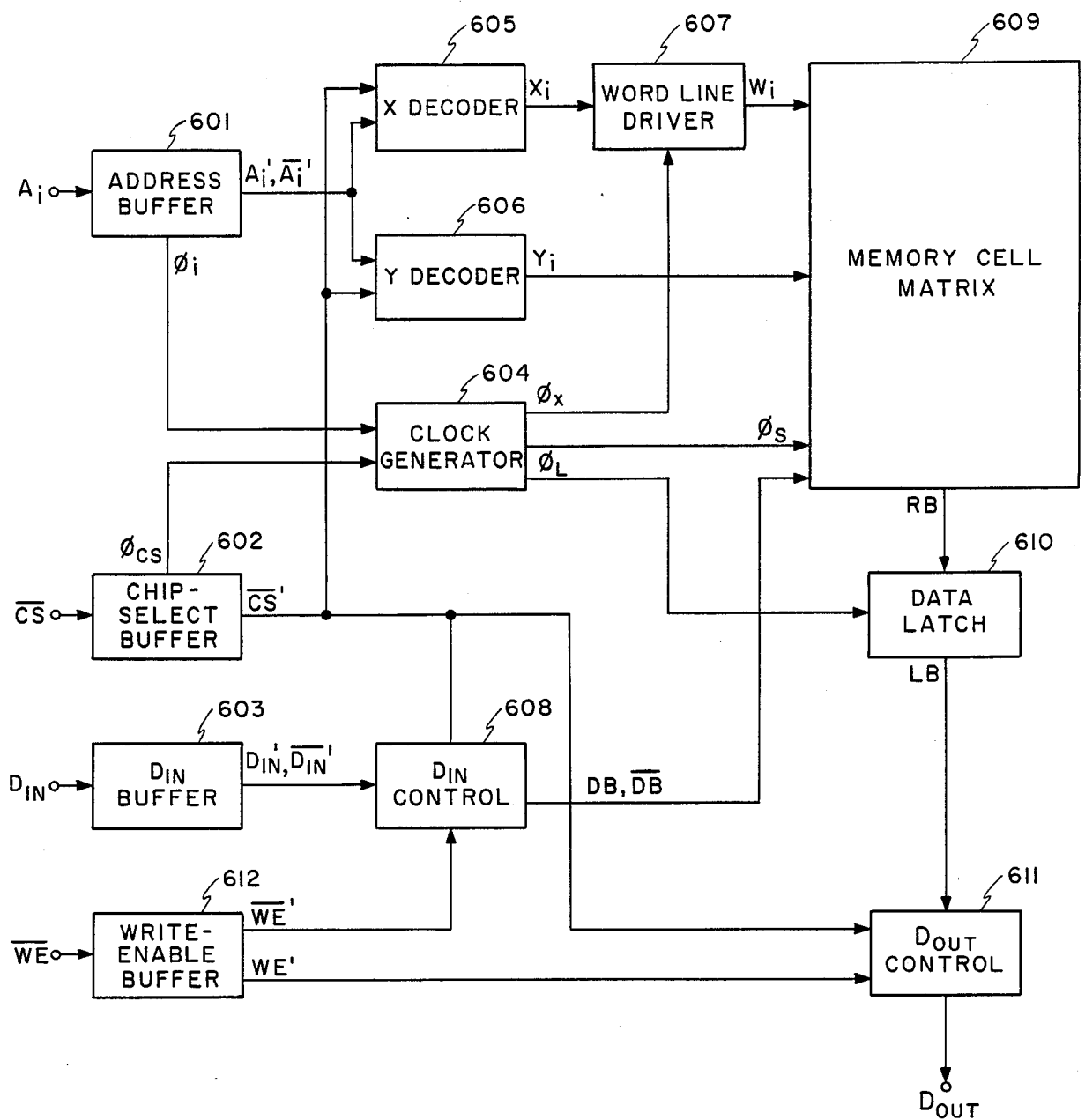
FIG. 1 is a block diagram of a semiconductor memory according to prior art.

In FIG. 1, the block diagram of the memory according to prior art is shown. Address signals $A_i$ (i=0, . . . , n), a chip-select signal $\overline{CS}$, an input data signal $D_{IN}$ and a write-enable signal $\overline{WE}$ as external signals are supplied to input buffers 601, 602, 603 and 612, respectively. X and Y address decoders 605 and 606 respond to address buffer signals $A_i'$ and $\overline{A_i'}$ and a chip-select buffer signal $\overline{CS'}$ and produce X and Y address decode signals $X_i$ and $Y_j$, respectively. A clock generator 604 responds to an address change detection signal $\phi_i$ and a chip-select change detection signal $\phi_{CS}$ and generates a word line driver activating signal $\phi_X$, a sense-enable signal $\phi_S$ and a data latch signal $\phi_L$. These signals $\phi_X$, $\phi_S$ and $\phi_L$ are generated in that order and disappear at an approximately simultaneous time, as shown in FIG. 2. A word line driver 607 selects one of word lines in a memory cell matrix 609 in response to the address decode signal $X_i$ and the activating signal $\phi_X$. Memory cells connected to the selected word line are thereby energized, so that the data stored therein are read out. At this time, the Y decode signal $Y_j$ selects one of bit lines in the matrix 609, and therefore the data stored in the memory cell which is disposed at the intersection of the selected word and bit lines is supplied to a sense amplifier (not shown in FIG. 1). The sense amplifier is activated by the sense-enable signal $\phi_S$ to amplify the data signal stored in the designated memory cell. This amplified signal is represented as a read-out data RB in FIG. 1. The activating signal $\phi_X$ and the sense-enable signal $\phi_S$ are generated as a pulse signal, as apparent from FIG. 2. Accordingly, the selection of the memory cell and the activation of the sense amplifier is carried out only during a part of one cycle period of the data read-out operation. The power consumption is thereby reduced.

The disenabled state of the sense amplifier invalidates the read-out data RB, but the data RB is latched in the data latch circuit 610 as a latched data LB. The data RB is written into the latch circuit 610 in response to the latch clock signal $\phi_L$ which is generated after the generation of the sense-enable signal $\phi_S$, so that the circuit 610 generates the latched data LB. Therefore, a time delay due to the latch circuit 610 occurs avoidably between the appearances of the read-out data RB and the latched data LB. This time delay is represented by $D_2$ in FIG. 2. A time delay $D_1$ denotes a time difference between the latch clock $\phi_L$ and the read-out data RB. The latched data LB is supplied to a data output control circuit 611.

The output control circuit 611 is activated when the write-enable signal $\overline{WE}$ is not supplied. When the signal $\overline{WE}$ is in a low level, a data input control circuit 608 is activated by a buffer signal $\overline{WE'}$ and the input data $D_{IN}$ is written into the selected memory cell. When the signal $\overline{WE}$ is in a high level, an internal signal WE' activates the output control circuit 611 as an energizing signal, so that an output data $D_{OUT}$ is produced at a data output terminal. A time delay represented by $D_3$ in FIG. 2 between the appearances of the latched data LB and the output data $D_{OUT}$ occurs in the output control circuit 611.

Thus, the presence of the data latch circuit 610 causes a time delay of $(D_1+D_2+D_3)$ from a time point at which the read-out data RB is produced to a time point at which the output data appears, and accordingly a high speed data read-out operation is not attained.

DETAILED DESCRIPTION OF THE EMBODIMENT

Figure 4:
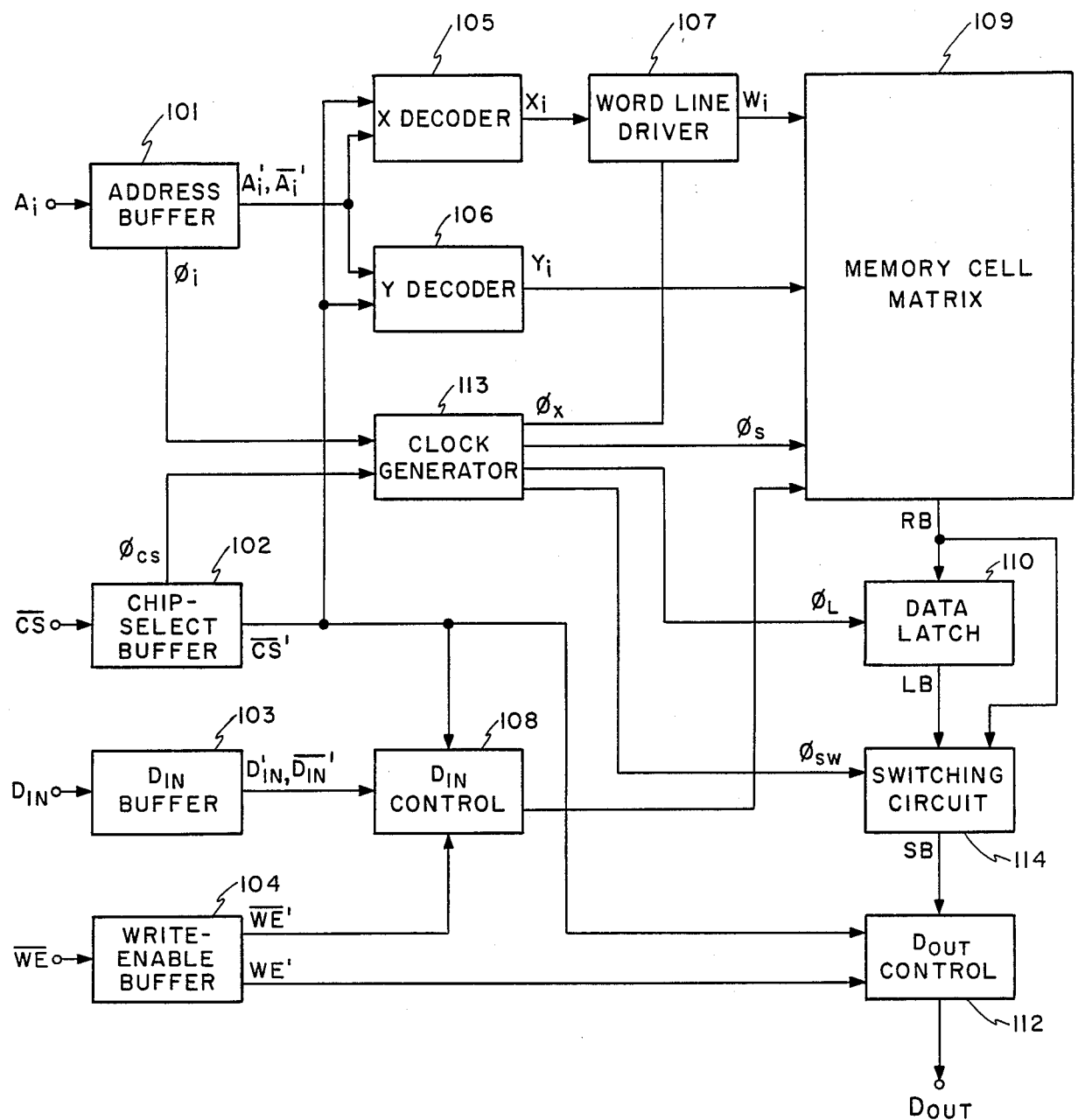
FIG. 4 is a block diagram of a semiconductor memory according to a preferred embodiment of the present invention.

Referring to FIG. 4, a static random access memory (S-RAM) according to a preferred embodiment of the present invention receives address signals $A_i$ (i=0, 1, ..., n) which are supplied to an input buffer 101. A chip-select signal $\overline{CS}$ is supplied to an input buffer 102. An input data signal $D_{IN}$ and a write-enable signal $\overline{WE}$ are supplied to input buffer 103 and 104, respectively.

Figure 5:
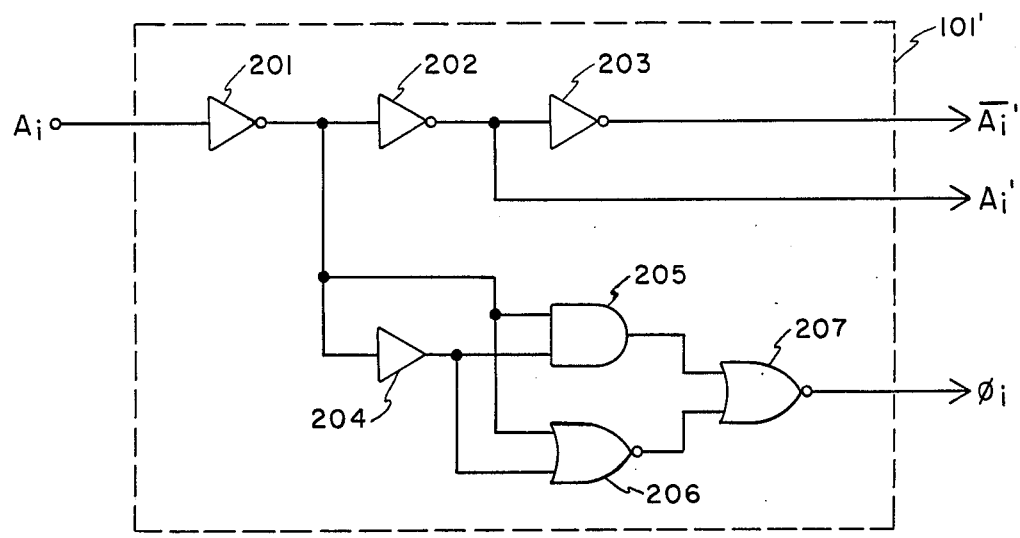
FIG. 5 is a logic circuit diagram of an address buffer shown in FIG. 4.

In FIG. 5, there is shown a logic circuit of the input buffer 101' connected to one address input terminal. Address buffer signals Ai' and $\overline{Ai'}$ are produced by three inverters 201 to 203. The buffer 101' further includes a delay circuit 204, an AND circuit 205 and two NOR circuits 206 and 207, and thus also produces an address change detection signal $\phi_i$ of a one-shot pulse shape when any one of the address signals $A_i$ changes from the low level to the high level or from the high level to the low level. The pulse width of the signal $\phi_i$ is determined by the delay time of the delay circuit 204.

Figure 6:
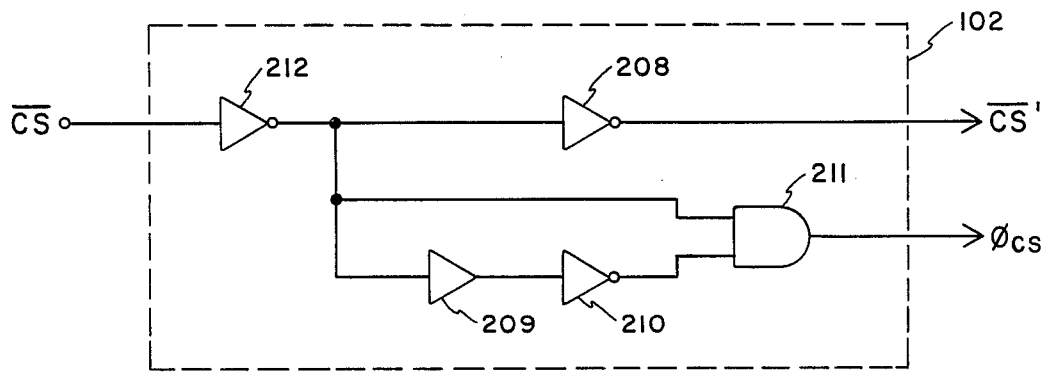
FIG. 6 is a logic circuit diagram of a chip-select buffer shown in FIG. 4.
Figure 7:
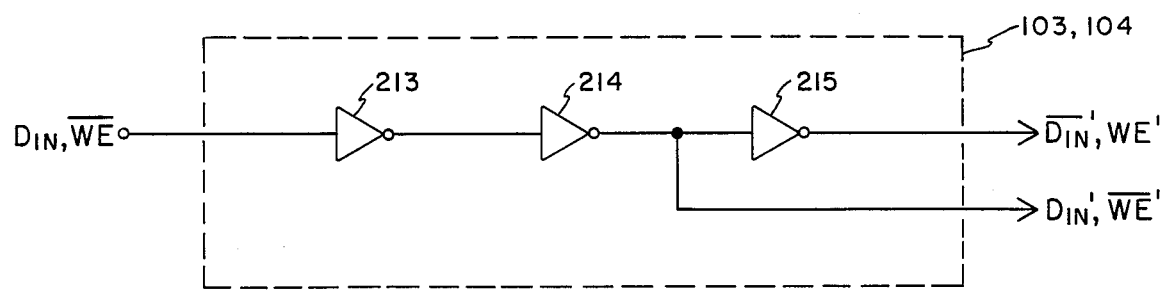
FIG. 7 is a logic circuit diagram of data and write-enable input buffers shown in FIG. 4.

The chip-select input buffer 102 is composed of, as shown in FIG. 6, three inverters 208, 210 and 212, a delay circuit 209, and an AND circuit 211, and generates a chip-select change detection signal $\phi_{CS}$ and a chip-select buffer signal $\overline{CS'}$. The chip-select change detection signal $\phi_{CS}$ is generated when the ship-select signal $\overline{CS}$ changes from the high level to the low level, i.e., when the memory changes from a nonselection state to a selection state, and its pulse width is determined by a delay time of the delay circuit 209. Each of the input buffers 103 and 104 is composed of three inverters 213 to 215, as shown in FIG. 7.

Figure 10:
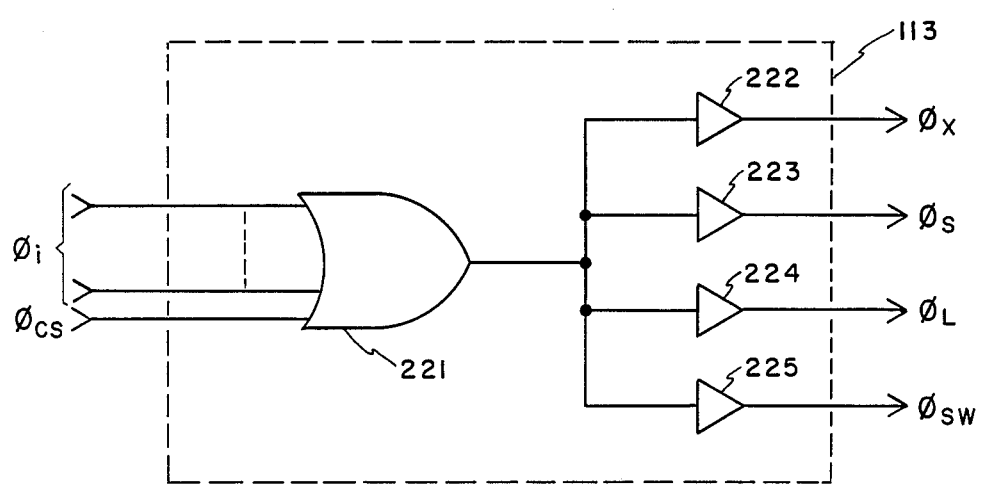
FIG. 10 is a logic circuit diagram of a clock generator shown in FIG. 4.
Figure 14:
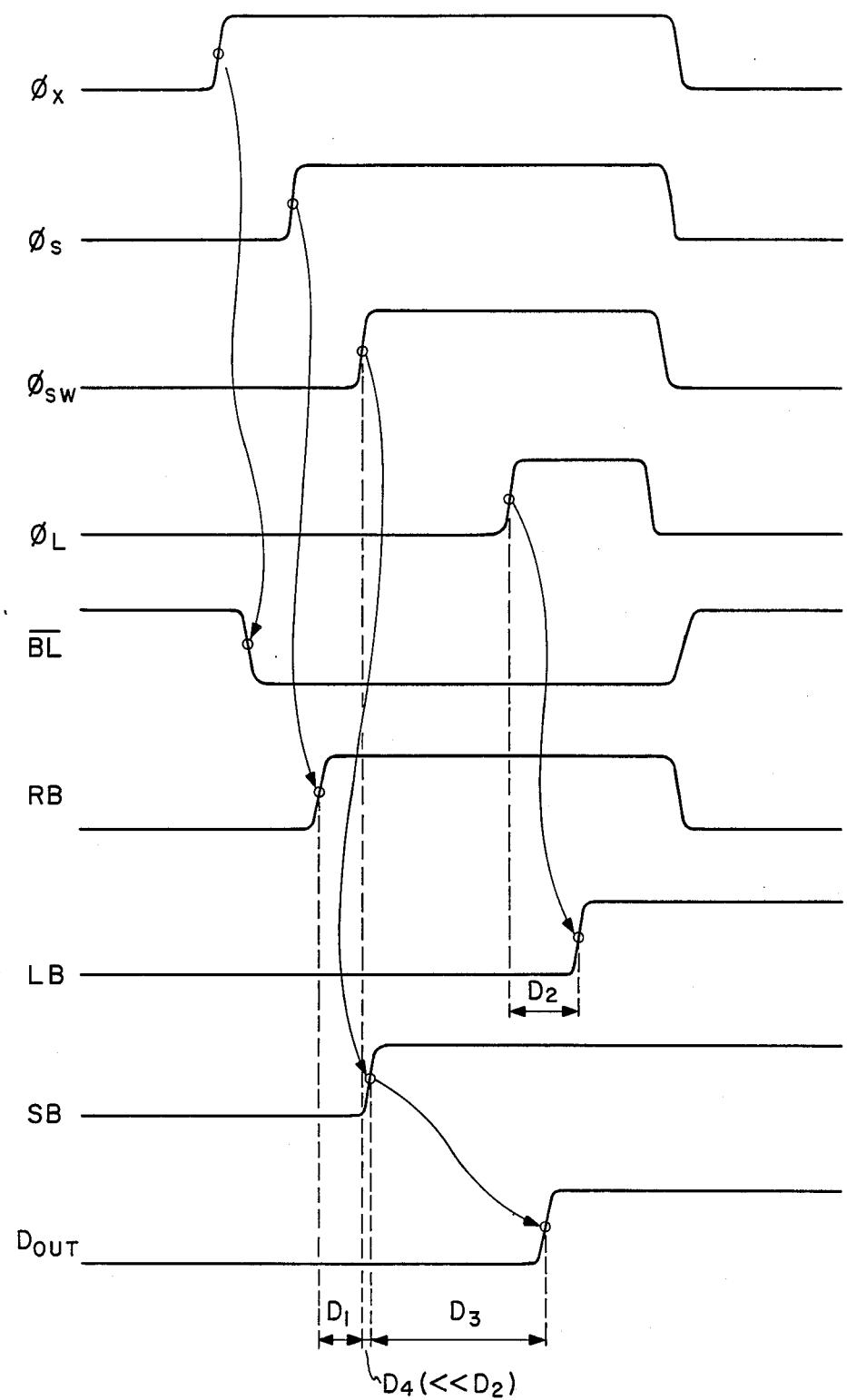
FIG. 14 is a signal waveform diagram explaining a data read operation of the memory shown in FIG. 4.

The detection signals $\phi_i$ and $\phi_{CS}$ are supplied to a clock generator 113. The clock generator 113 includes, as shown in FIG. 10, an OR circuit 221 supplied with the signals $\phi_i$ (i=0, 1, ..., n) and $\phi_{CS}$, and further includes signal generators 222 to 225 receiving the output of the OR circuit 221. A word line activating signal $\phi_X$, a sense-enable signal $\phi_S$, a switching control signal $\phi_{SW}$ and a latch clock signal $\phi_L$ are produced by the signal generators 222, 223, 224 and 225, respectively. The signals $\phi_X$, $\phi_S$, $\phi_{SW}$ and $\phi_L$ change to the high level in that order, and return to the low level in the order of $\phi_L$, $\phi_{SW}$, $\phi_S$ and $\phi_X$ but approximately simultaneously, as shown in FIG. 14.

Figure 8:
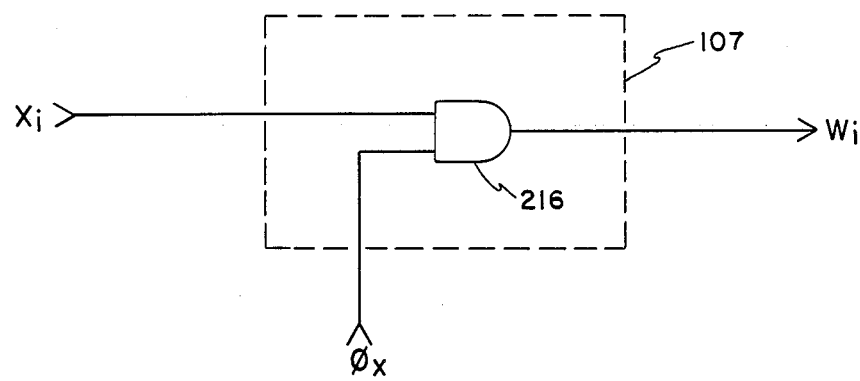
FIG. 8 is a logic circuit diagram of a word line driver shown in FIG. 4.

The word line activating signal $\phi_X$ is supplied to a word line driver 107 which is also supplied with an address decode signal $X_i$ from an X address decoder 105. As shown in FIG. 8, the driver 107 includes an AND circuit 216, and therefore it energizes a word line $W_i$ corresponding to the X address decode signal $X_i$ only during a time when the word line activating signal $\phi_X$ is in the high level. When the signal $\phi_X$ assumes the low level, the word line $W_i$ takes the low level irrespective of the high level of the decode signal $X_i$. By doing so, the selection time of the word line is shortened.

Figure 9:
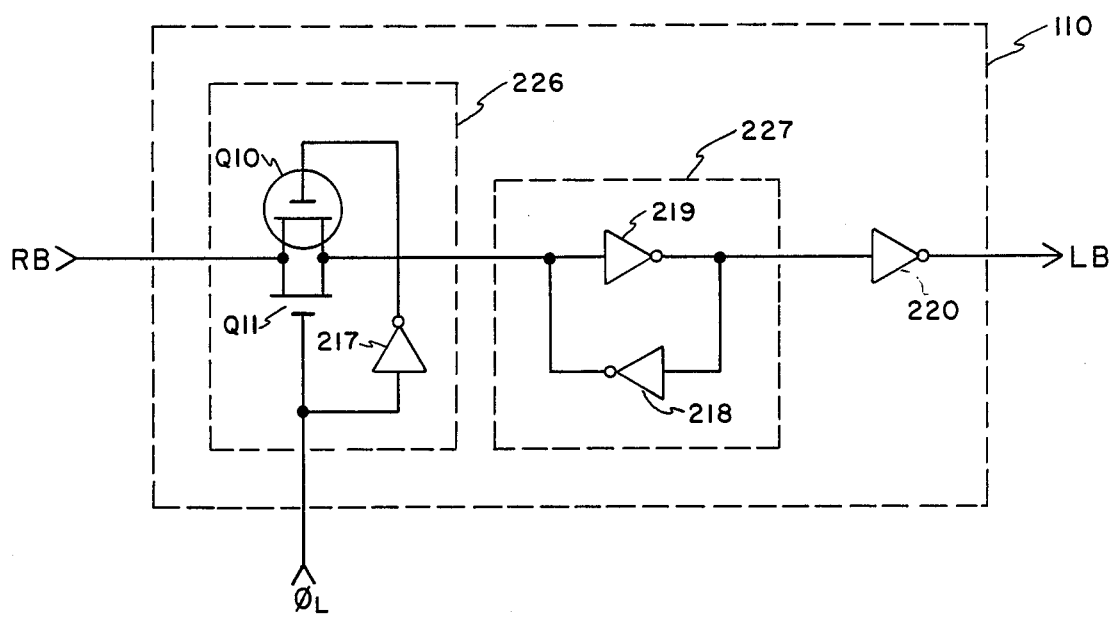
FIG. 9 is a circuit diagram of a data latch circuit shown in FIG. 4.

As shown in FIG. 9, a data latch circuit 110 includes a transfer gate 226 composed of a P-channel MOS transistor $Q_{10}$, an N-channel MOS transistor $Q_{11}$ and an inverter 217 and a flip-flop circuit 227 composed of two inverters 218 and 219. The output of the flip-flop circuit 227 is supplied to an inverter 220 to obtain a latched data LB. It is noted that in order to differentiate the P-channel transistor from the N-channel transistor, the P-channel transistor is surrounded by a circle. The transfer gate 226 is turned on only when the latch clock $\phi_L$ assumes the high level, and the data latch circuit 110 introduces a read-out data RB produced from a memory cell matrix 109 thereinto. The data RB is latched by the flip-flop 227, and the latched data LB is supplied to a data output control circuit 112.

Figure 13:
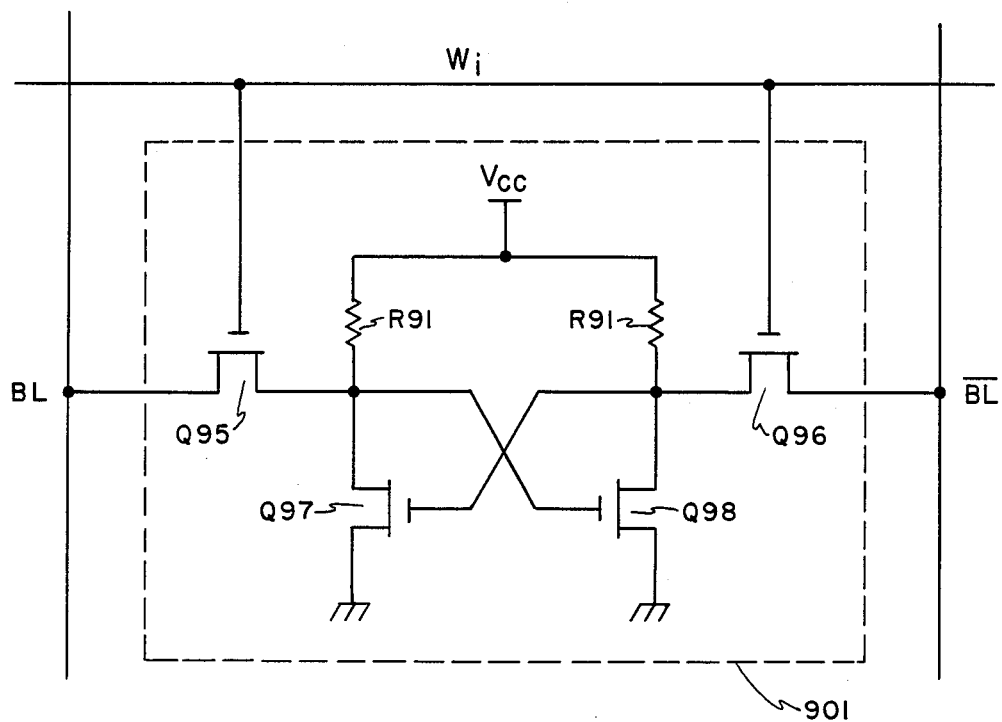
FIG. 13 is a circuit diagram of one memory cell shown in FIG. 12.
Figure 12:
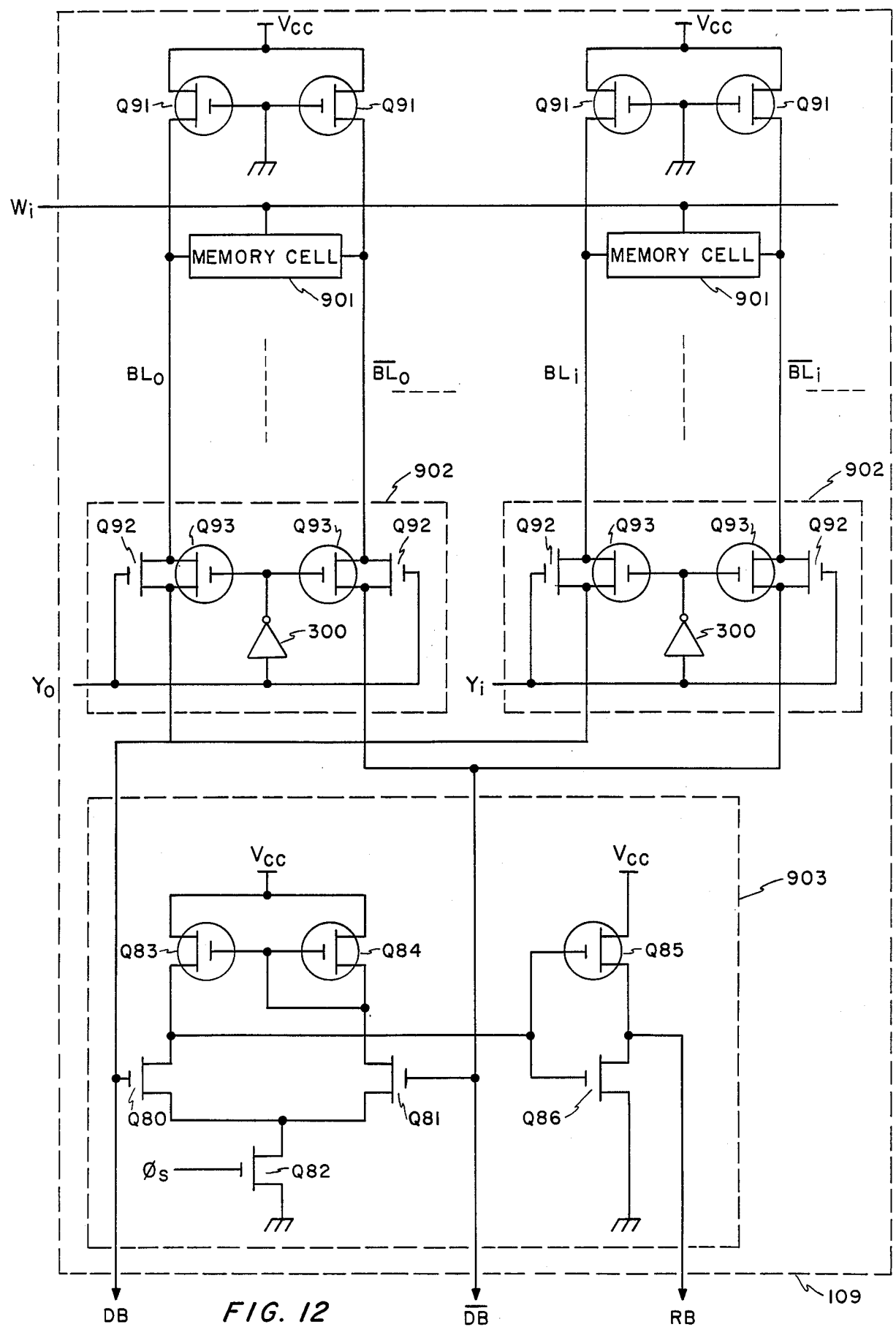
FIG. 12 is a circuit diagram of a memory cell matrix shown in FIG. 4.

FIG. 12 shows the circuit construction of the memory cell matrix 109. A memory cell 901 is disposed at the respective intersections of the word and bit lines $W_i$ and $BL_i$. The memory cell 901 includes, as shown in FIG. 13, two load resistors $R_{91}$ and four N-channel transistors $Q_{95}$ to $Q_{98}$.

Turning back to FIG. 12, a load transistor $Q_{91}$ (P-channel type) is connected between one end of each bit line BL and a power supply terminal $V_{cc}$, and the other end of each bit line is connected to a transfer gate 902. Each transfer gate 902 has two N-channel transistors $Q_{92}$, two P-channel transistors $Q_{93}$ and an inverter 300, and one of the transfer gates 902 is turned on by an address decode signal $Y_j$ produced by a Y address decoder 106 (FIG. 4). The true and complementary outputs of a pair of bit lines BL and $\overline{BL}$ are supplied through the transfer gate 902 in the on-state to a pair of input terminals of a sense amplifier 903, respectively, and further to a pair of output terminals DB and $\overline{DB}$ of a data input control circuit 108 (FIG. 4), respectively. The input control circuit 108 supplies true and complementary signals DB and $\overline{DB}$ of the input data $D_{IN}$ to be written into the selected memory cell 901 under the control of the write-enable signal $\overline{WE}$ (accordingly $\overline{WE'}$).

The sense amplifier 903 includes transistors $Q_{80}$ and $Q_{81}$ connected in a differential form which is driven by a current source transistor $Q_{82}$ supplied at its gate with the sense-enable signal $\phi_S$. That is, the sense amplifier 903 is enabled by the sense-enable signal $\phi_S$. Transistors $Q_{83}$ and $Q_{84}$ forms a current mirror circuit and functions as active loads of the transistors $Q_{80}$ and $Q_{81}$. An output signal is derived from the transistor $Q_{80}$ and then supplied to an inverter composed of transistors $Q_{85}$ and $Q_{86}$. The read-out data RB is thereby obtained, which corresponds to the data stored in the selected memory cell.

Figure 11:
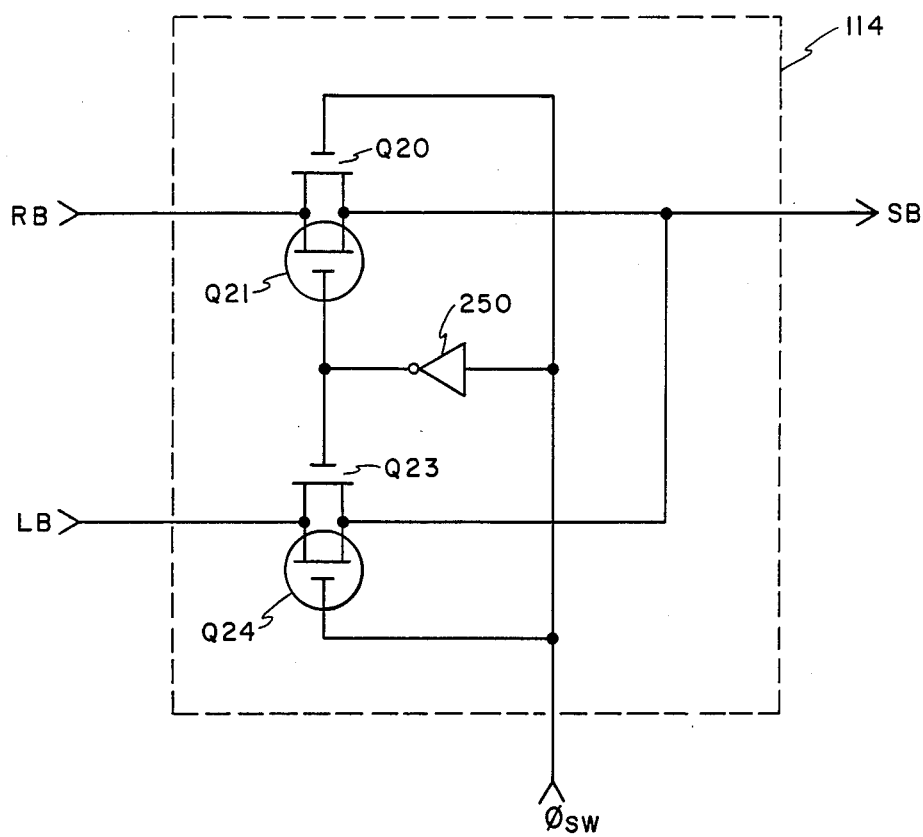
FIG. 11 is a circuit diagram of a switching circuit shown in FIG. 4.

The read-out data RB from the matrix 109 is supplied to the data latch circuit 110 and further to a first input terminal of a switching circuit 114 (FIG. 4) which is newly provided in accordance with the present invention. The circuit 114 further has a second input terminal supplied with the latched data LB from the data latch circuit 110. The switching circuit 114 includes, as shown in FIG. 11, N-channel and P-channel transistors $Q_{20}$ and $Q_{21}$ connected in parallel between the first input terminal and its output terminal and N-channel and P-channel transistors $Q_{23}$ and $Q_{24}$ connected in parallel between the second input terminal and the output terminal. The switching control signal $\phi_{SW}$ is supplied directly to the gates of the transistors $Q_{20}$ and $Q_{24}$ and through an inverter 250 to the gates of the transistors $Q_{21}$ and $Q_{23}$. Accordingly, when the control signal $\phi_{SW}$ assumes the low level, the circuit 114 selects the latch-data LB and outputs it as a switching data SB, whereas the read-out data RB is selected when the signal $\phi_{SW}$ is in the high level.

The circuit operation of the memory shown in FIG. 4 is as follows:

In the selection state of the memory, i.e., in the case where the chip-select signal $\overline{CS}$ is in the low level, when the address signals $A_i$ change, at least one of the address-decoder output signals $X_i$ and $Y_j$ are varied. In addition, the detection signal $\phi_i$ is produced in response to the change in the address signals $A_i$, so that the clock generator 113 generates the word line activating signal $\phi_X$, the sense-enable signal $\phi_S$, the switching control signal $\phi_{SW}$ and the latch clock signal $\phi_L$, which signals are sequentially changed from the low level to the high level, in this order, as shown in FIG. 14. By the change in the activating signal $\phi_X$ to the high level, the word line $W_i$ corresponding to the address-decoder output $X_i$ is energized to turn on transfer gate transistors $Q_{95}$ and $Q_{96}$ in each memory cell 901 connected to this energized word line. As a result, the data stored in the memory cell 901 appears on the bit lines BL and $\overline{BL}$ in pair in the complementary form. On the other hand, in response to a new address-decoder output $Y_j$, one transfer gate 902 in the cell matrix 109 is made conductive. At this time, if the write-enable signal $\overline{WE}$ is in the low level, a data write operation is carried out to supply the true and complementary data DB and $\overline{DB}$ of the input data $D_{IN}$ to the selected memory cell 901 from the data input control circuit 108. The data output control circuit 112 is in the disenable state at this time to inhibit the data output. When the signal $\overline{WE}$ is in the high level, a data read-out operation is carried out. If the selected memory cell 901 stores the data "1" therein, the transistor $Q_{98}$ in the cell is in the conductive state, and therefore the bit line $\overline{BL}$ is changed to the low level, as shown in FIG. 14.

The sense-enable signal $\phi_S$ thereafter rises to the high level to enable the sense amplifier 903. Since the transistors $Q_{80}$ and $Q_{81}$ are supplied at their gates with the high level and the low level, respectively, the read-out data RB from the sense amplifier 903 changes to the high level, as shown in FIG. 14.

After the read-out data RB appears, the switching control signal $\phi_{SW}$ rises to the high level. This time delay is represented by $D_1$ in FIG. 14 and is equal to the time delay $D_1$ shown in FIG. 2 between the data RB and the signal $\phi_L$.

The rise-up of the switching control signal $\phi_{SW}$ causes the switching circuit 114 to select the read-out data RB. The data RB is thereby supplied to the data output control circuit 112. The time required for selecting the data RB is represented by $D_4$ in FIG. 14. This time $D_4$ is substantially short and is extremely smaller than the time delay $D_2$ of the latch circuit 610 (see FIGS. 1 and 2), because the circuit 114 merely attains the switching operation. The output control circuit 112 responds to the switching data SB and produces an output data $D_{OUT}$ after the passage of the operating time required by the circuit 112 itself. The operating time is denoted by $D_3$ in FIG. 14.

Figure 2:
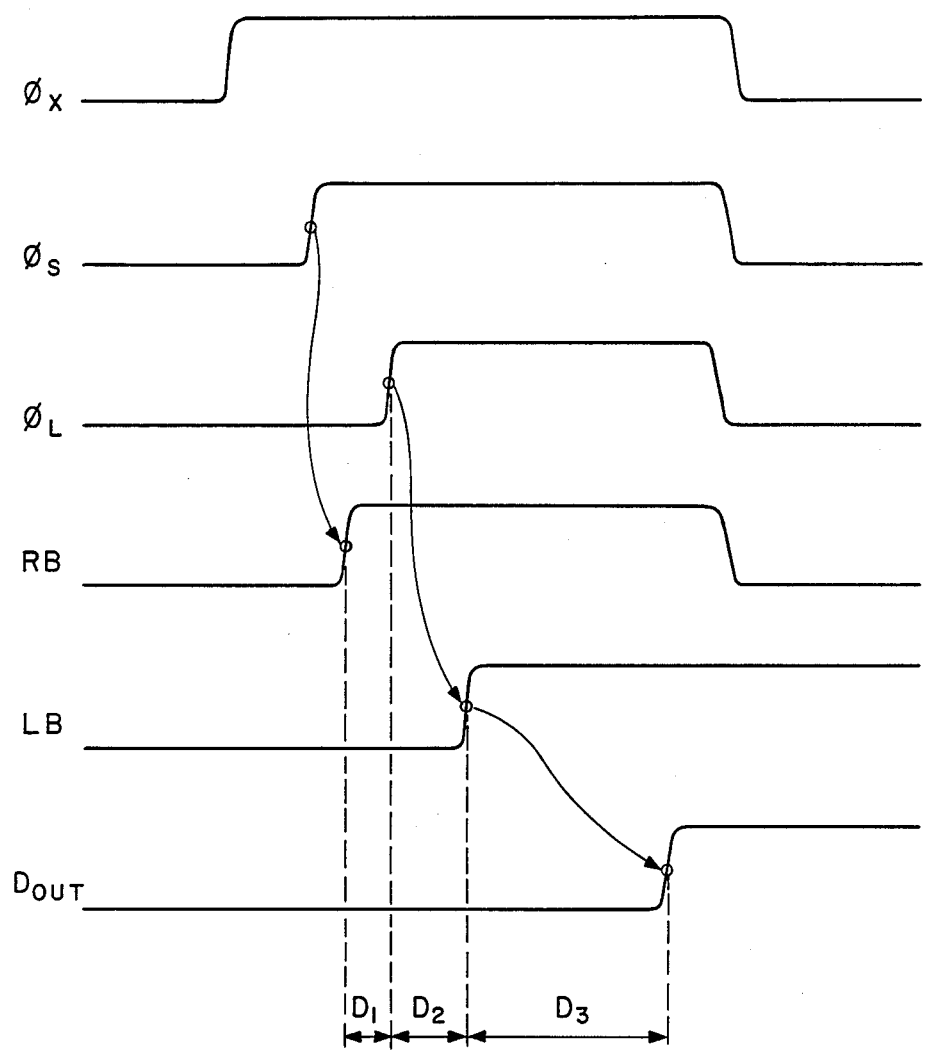
FIG. 2 is a signal waveform diagram for explaining a data read operation of the memory shown in FIG. 1.

Accordingly, the time delay from a time point at which the read-out data RB is produced to a time point at which the output data $D_{OUT}$ appears is represented by $(D_1+D_4+D_3)$, which is considerably smaller than the time delay represented by $(D_1+D_2+D_3)$ in FIG. 2, and the memory shown in FIG. 4 attains the data read-out operation at a very high speed.

After the rise-up of the switching control signal $\phi_{SW}$, the latch clock signal $\phi_L$ rises to the high level. When the latch clock $\phi_L$ rises, after the passage of the time delay $D_2$ (which corresponds to a time required for operation of the transfer gate 226 and the flip-flop 227 shown in FIG. 9), the latched data LB is generated.

After the generation of the latch-data LB, the signals, $\phi_L, \phi_{SW}, \phi_S$ and $\phi_X$ fall to the low level in that order but approximately simultaneously. The switching circuit 114 thereby selects the latched data LB and supplies it to the output control circuit 112. Accordingly, even if the read-out data RB is invalidated by the change in the sense-enable signal $\phi_S$ to the low level, the output data $D_{OUT}$ is maintained. Since the sense amplifier 903 is inactivated and the word line $W_i$ is disenergized, the power consumed by the memory cell matrix 109 is considerably suppressed.

As described above, the semiconductor memory according to the present invention is advantageous in that the data read operation is carried out at a very high speed with a low power consumption.

Moreover, the memory according to the present invention provides such an advantage that a maloperation is prevented against noise signals which may be applied to address input terminals, by suppressing generating of the latch clock $\phi_L$ in response to such noise signals. In the semiconductor memory, it is permissible that the output data $D_{OUT}$ changes temporarily in response to noise pulses applied to the address input terminals, but after the noise pulses disappear, the level of the output data $D_{OUT}$ should return to the true level.

Figure 3:
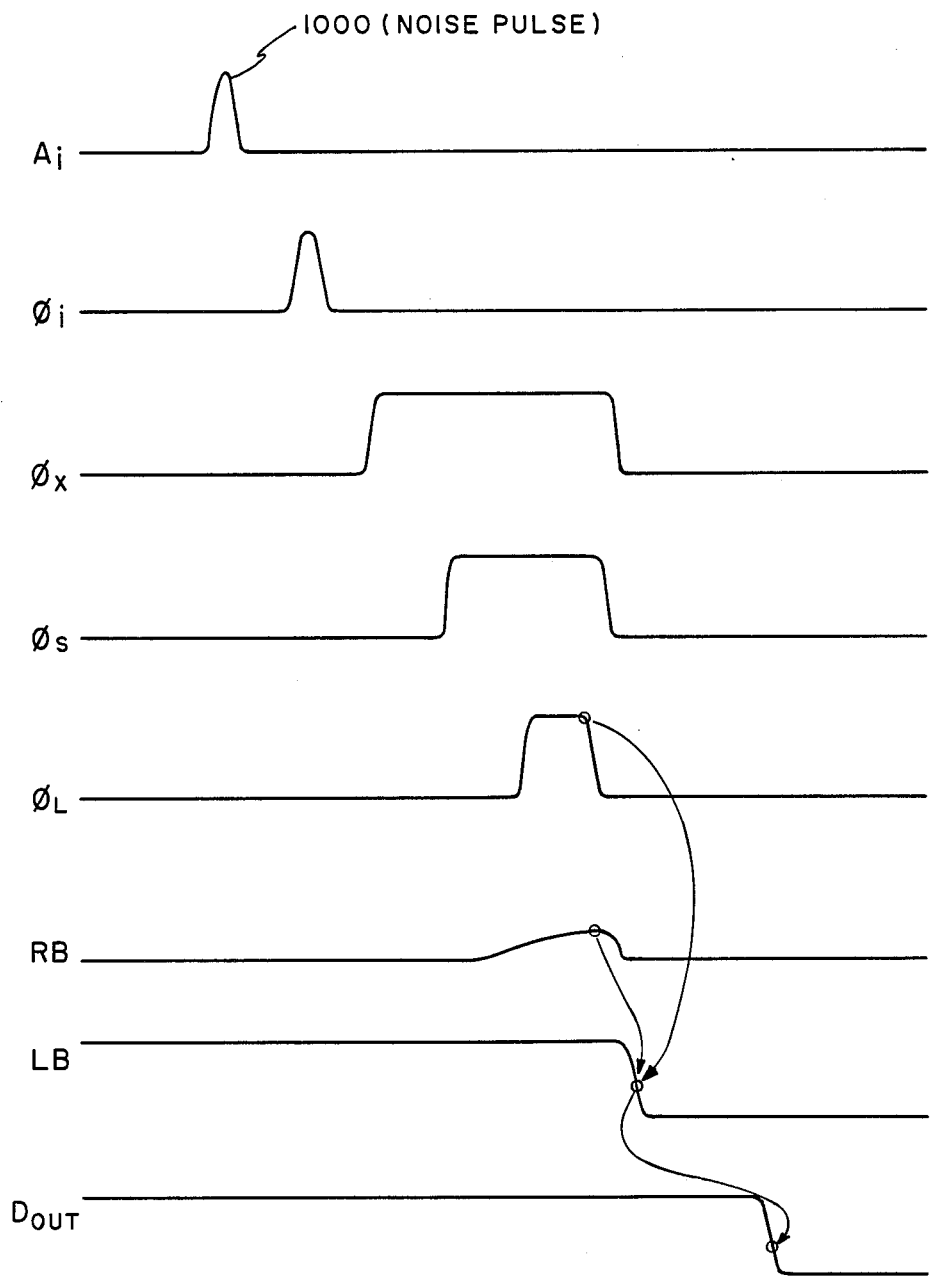
FIG. 3 is a signal waveform diagram responsive to a noise pulse in the memory of FIG. 1.

In the prior art memory shown in FIG. 1, the output data $D_{OUT}$ is often destroyed by the noise applied to the address input terminal, as shown in FIG. 3. In FIG. 1, when any one of the address inputs $A_i$ is changed in its level momentarily by a noise pulse 1000 shown in FIG. 3, the address buffer 601 is caused to produce the address change detection signal $\phi_i$. It is apparent that this signal $\phi_i$ has its pulse width approximately equal to the width of the pulse noise 1000. For this reason, the word line activating signal $\phi_X$, the sense-enable signal $\phi_S$ and the latch clock signal $\phi_L$ are resulted in being generated as shown in FIG. 3, although their pulse widths are short considerably as compared with those shown in FIG. 2 in the normal operation. On the other hand, when the word line activating signal $\phi_X$ is produced, the pulse noise 1000 has already disappeared and the levels at the address input terminals return to their former levels. As a result, the memory cell 901 which has been selected by the address signals right before the application of the noise pulse 1000, is selected again.

The increase in memory capacity in the semiconductor memory, i.e. the increase in number of the memory cells, causes the deviation in electrical characteristics and/or in a dimentional size of the respective transistors in each memory cell. For this reason, among the memory cells, there is frequently produced a memory cell whose current ability is made lowered considerably. Such a memory cell will be called hereinafter "weak memory cell".

Assume now that the weak memory cell storing the data "1" therein is selected again in response to the disappearance of the noise pulse 1000 applied to the address input terminal. Since the weak memory cell stores the data "1", the latch-data LB and the output data $D_{OUT}$ are in the high level as shown in FIG. 3. However, the output data RB of the sense amplifier is in the low level by the natural discharge or by the forcible discharge using a discharge circuit (not shown). The second selection of the weak memory cell lowers the potential of one of the bit lines in pair in accordance with the data stored in the weak memory cell, but the lowering of the potential of the bit line is performed at a relatively slow rate, because the current ability of the weak memory cell is considerably small. For this reason, the potential difference between the input terminals of the sense amplifier is remarkably small at a time when the sense-enable signal $\phi_S$ is generated, and the output data RB of the sense amplifier does not present a large change in its potential level, but changes slowly to the high level as shown in FIG. 3. The data latch circuit 610 introduces the read-out data RB therein in response to the generation of the latch clock $\phi_L$, and since the level of the read-out data RB is substantially in the low as shown in FIG. 3, the level of the latch-data LB starts to fall. Since the signals $\phi_X$, $\phi_S$ and $\phi_L$ are generated in response to the pulse noise 1000, their pulse widths are considerably small, as mentioned hereinbefore. For this reason, these signals $\phi_X$, $\phi_S$ and $\phi_L$ disappear before the read-out data RB takes substantially the high level, so that the latch-data LB is changed to the low level, as shown in FIG. 3. The output data $D_{OUT}$ is thereby inverted to the low level. The output data $D_{OUT}$ should be return to the high level, because the weak memory cell stores the data "1". However, the output data $D_{OUT}$ is maintained at the low level. That is, the prior art memory shown in FIG. 1 also has such a defect that it produces the incorrect output data $D_{OUT}$ in response to the noise pulse applied to any one of the address input terminals.

Figure 15:
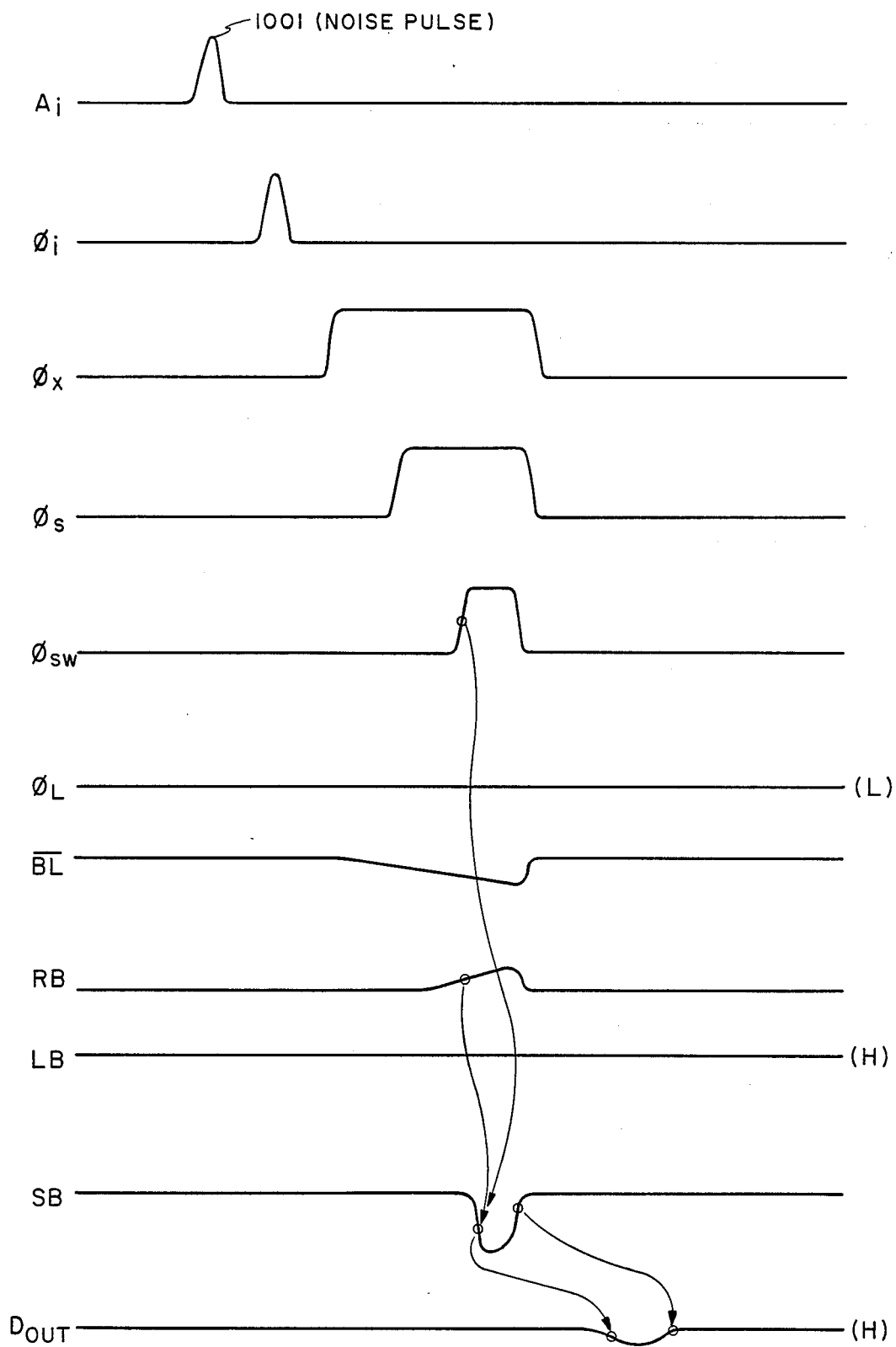
FIG. 15 is a signal waveform diagram responsive to a noise pulse in the memory shown in FIG. 4.

To the contrary, in the semiconductor memory according to the present invention, even if the weak memory cell is selected again in response to the disappearance of a noise pulse, the output data $D_{OUT}$ merely changes temporarily and it returns to the level corresponding to the data stored in the memory cell, by suppressing generation of the latch clock signal $\phi_L$ in response to an address-input signal having a short pulse-width. This circuit operation is shown in FIG. 15. Assuming that the weak memory cell storing the data "1" has been selected by the true address signals $A_i$ before the application of a noise pulse 1001, both the latch-data LB and the output data $D_{OUT}$ hold the high level, but the output data RB of the sense amplifier 903 (FIG. 12) takes the low level by the natural discharge or the forcible discharge using a discharge circuit (not shown) and the bit lines BL and $\overline{BL}$ assume the high level by the transistors $Q_{91}$ (FIG. 12). When the weak memory cell is selected again by the disappearance of the noise pulse 1001, the potential on the bit line $\overline{BL}$ is reduced at a considerable slow rate as shown in FIG. 15, because the weak memory cell has a very low current ability. As a result, the read-out data RB from the sense-amplifier 903 changes slowly in its level, as also shown in FIG. 15. In this condition, the switching circuit 114 selects the read-out data RB in response to the application of the switching control signal $\phi_{SW}$, so that the output data $D_{OUT}$ is lowered in its level, as shown in FIG. 15. However, the semiconductor memory in this embodiment is constructed such that the latch clock $\phi_L$ which is used to latch the read-out data RB by the data latch circuit 114, is not generated against the noise pulse 1001. As a result, the output data $D_{OUT}$ is returned to the high level.

Figure 16:
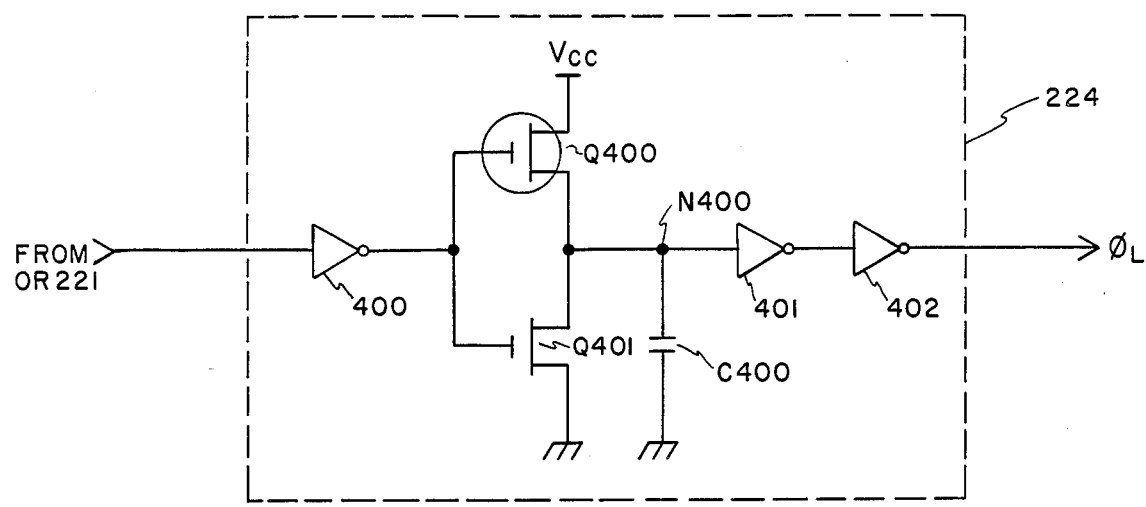
FIG. 16 is a circuit diagram of a latch clock generator shown in FIG. 10.
Figure 17:
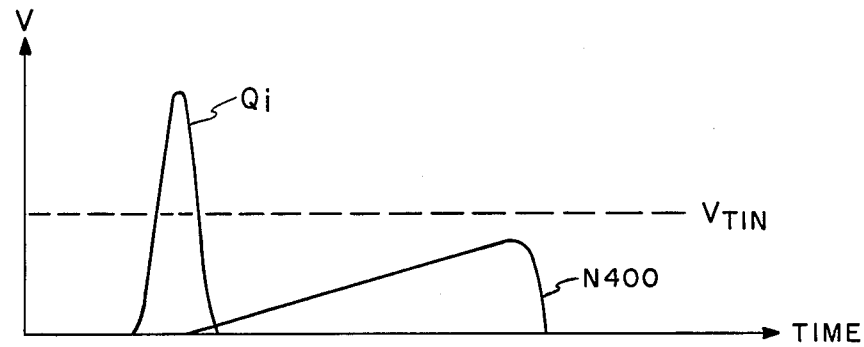
FIG. 17 is a signal waveform diagram responsive to a noise pulse in the circuit shown in FIG. 16.

It is shown in FIGS. 16 and 17 that the latch clock $\phi_L$ is not generated against the noise. FIG. 16 shows the circuit of the latch clock generator 224 shown in FIG. 10, and FIG. 17 shows the signal waveform diagram of the generator 224. The output of the OR circuit 221 (FIG. 10) is supplied in common to the gates of P-channel and N-channel transistors $Q_{400}$ and $Q_{401}$ through an inverter 400. The transistors $Q_{400}$ and $Q_{401}$ are connected in series between the power supply terminals, and the connection point $N_{400}$ therebetween is connected to a capacitor $C_{400}$ to constitute a delay circuit. The node $N_{400}$ is further connected to the latch clock output terminal through two inverters 401 and 402. The address change detection signal $\phi_i$ generated in response to the noise pulse 1001 is supplied to the inverter 400 through the OR circuit 221. When the level of the signal $\phi_i$ exceeds the threshold level of the inverter 400 which is substantially equal to those of the inverters 401 and 402 and represented by $V_{TIN}$ in FIG. 17, the output of the inverter 400 changes to the low level to turn the transistor $Q_{400}$ ON and the transistor $Q_{401}$ OFF, respectively. The capacitor $C_{400}$ is thereby charged to increase the potential at the node $N_{400}$, but the current ability of the transistor $Q_{400}$ is designed to be relatively low, and therefore the increasing rate of the potential at the node $N_{400}$ is considerably small. Since the signal $\phi_i$ is generated in response to the noise pulse 1001, it disappears before the level of the node $N_{400}$ exceeds the threshold level $V_{TIN}$ of the inverter 401, so that the transistor $Q_{401}$ is turned ON. The current ability of the transistor $Q_{401}$ is selected to be relatively large, and therefore the node $N_{400}$ changes to the low level relatively quickly, as shown in FIG. 17. The latch clock $\phi_L$ is therefore not generated in response to the application of the noise signal as shown in FIG. 15. The clock $\phi_L$ is generated only when the pulse width of the pulse signal $\phi_i$ is larger than a predetermined width, as in the example illustrated in FIGS. 16 and 17. The clock $\phi_L$ may be generated only when the pulse signal $\phi_S$ or $\phi_{SW}$ is detected to have a pulse width larger than a predetermined pulse width.

Turning back to FIG. 15, since the latch clock $\phi_L$ in this embodiment is not generated for the noise input, the latched data LB from the data latch circuit 110 is not changed. In response to the level-down of the switching control signal $\phi_{SW}$, the switching circuit 114 selects the latched data LB to supply it to the data output control circuit 112. The output data $D_{OUT}$ is thereby returned to its former level, i.e. the high level. Thus, although the output data $D_{OUT}$ is lowered temporarily in its level in response to the pulse noise 1001, it continues to assume the high level in practice. That is, the semiconductor memory according the present invention is also advantageous in that the malfunction does not occur against the noise signal.

To generate no latch clock $\phi_L$ in response to the pulse $\phi_i$ having a small pulse width delays the generation of the clock $\phi_L$ in response to the true address signals. However, the speed of the data read-out operation is secured by the operation of the switching circuit 114, as already mentioned with reference to FIG. 14.

Figure 18:
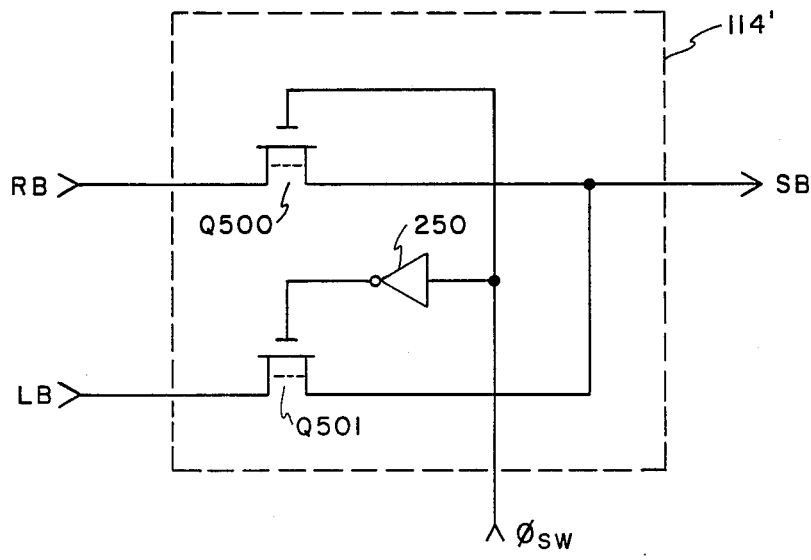
FIG. 18 is a circuit diagram showing another circuit construction of the switching circuit.

FIG. 18 shows another circuit construction of the switching circuit, as represented by 114', in which N-channel transistors $Q_{500}$ and $Q_{501}$ each having a low threshold level are employed in place of the transfer gates each composed of N-channel and P-channel transistors. The N-channel transistor of the low threshold level type may be used as the transfer gate 226 in the data latch circuit 110 of FIG. 9 and as the transfer gate 902 in the cell matrix 109 of FIG. 12. By using such a transistor, the circuit elements is reduced in number.

It is apparent that the present invention is not limited to the above-mentioned embodiments, but can be modified or changed without departing from the scope and spirit of the invention. For example, the memory may be constituted by only N-channel or P-channel transistors. The data input and output terminals may be used in common. MOS transistors may be used in place of the load resistors $R_{91}$ in the memory cell 901.

What is claimed is:

1. A semiconductor memory comprising a plurality of memory cells, a plurality of address terminals supplied with address signals, first means coupled to each of said address terminals for producing a pulse signal when a level of at least one of said address terminals is changed, second means responsive to said address signals for selecting one of said memory cells to read data out of the selected memory cell, third means responsive to said pulse signal for generating a control signal during a predetermined period of time, fourth means for detecting a pulse width of said pulse signal for producing a latch-enable signal when said pulse width of said pulse signal is larger than a predetermined width, a latch circuit having an input terminal supplied with said data read from said selected memory cell and an output terminal deriving a latched data and latching said data therein in response to said latch-enable signal, an output circuit, fifth means coupled between said input terminal of said latch circuit and said output circuit for supplying said data to said output circuit without passing through said latch circuit when said control signal is generated, and sixth means coupled between said output terminal of said latch circuit and said output circuit for supplying the data latched in said latch circuit to said output circuit when said control signal is not generated.

2. The semiconductor memory as claimed in claim 1, wherein said predetermined width is longer than any possible noise signal which may exist whereby said fourth means does not produce said latch-enable signal even when said first means produces said pulse signal in response to the noise signal being supplied to at least one of said address terminals.

3. The semiconductor memory as claimed n claim 1, wherein said fifth means includes a first switch circuit connected between said input terminal of said latch circuit and said output circuit and said sixth means includes a second switch circuit connected between said input terminal of said latch circuit and said output circuit, said first and second switch circuits being turned ON and OFF, respectively, when said control signal is generated, and turned OFF and ON, respectively, when said control signal is not generated.

4. The semiconductor memory as claimed in claim 1, wherein, said control signal is generated before said latch-enable signal which is in turn generated before said predetermined period of time elapses.

5. A semiconductor memory comprising a memory cell matrix including a plurality of word lines, a plurality pairs of bit lines and a plurality of memory cells each connected to one of said plurality of word lines and one pair of said plurality of pairs of bit lines, a plurality of address terminals supplied with address signals, decoder means responsive to said address signals for designating one word line and one pair of bit lines to select one of said memory cells, a sense amplifier having input terminals coupled to the designated pair of bit lines and an output terminal and producing read-out data at the output terminal thereof responsive to data stored in the selected memory cells, means coupled to each of said address terminals for producing a pulse signal when a level of any one of said address terminals is changed, means coupled to said pulse signal producing means for generating a switching control signal during a predetermined period of time in response to said pulse signal, a delay circuit coupled to said pulse signal producing means and including a capacitive element charged by said pulse signal, means coupled to said delay circuit for generating a latch-enable signal when a charging potential of said capacitive element exceeds a reference potential, a data latch circuit having an input terminal connected to said output terminal of said sense amplifier and an output terminal and latching said read-out data therein in response to said latch-enable signal, a switching circuit having a first input terminal connected to said output terminal of said sense apmlifier, a second input terminal connected to said output terminal of said data latch circuit and an output terminal, a data output terminal, and an output control circuit coupled between said output terminal of said switching circuit and said data output terminal and outputting an output data signal in response to data supplied from said switching circuit, said switching circuit selecting said read-out data produced by said sense amplifier when said switching control signal is generated to enable said read-out data to bypass said data latch circuit and selecting the data latched in said data latch circuit when said switcing control signal is not generated.

6. The semiconductor memory as claimed in claim 5, wherein said latch-enable signal is generated after said switching control signal is generated and said latch-enable signal disappears before said predetermined period of time elapses.

7. The semiconductor memory as claimed in claim 5, wherein said delay circuit further includes a first transistor charging said capacitive element when to said pulse signal is generated and a second transistor discharging said capacitive element when said pulse signal is not generated, said first transistor having current ability which is smaller than the current ability of said second transistor, whereby the charging potential of said capacitive element does not exceed said reference potential when said pulse signal has a pulse width which is smaller than a predetermined width.

8. The semiconductor memory as claimed in claim 7, wherein said pulse signal producing means produces said pulse signal having the pulse width which is smaller than said predetermined width when a noise signal changes the level of any one of said address terminals.

* * * * *